United States Patent
Huang et al.

(10) Patent No.: US 7,960,786 B2
(45) Date of Patent: Jun. 14, 2011

(54) BREAKDOWN VOLTAGES OF ULTRA-HIGH VOLTAGE DEVICES BY FORMING TUNNELS

(75) Inventors: Eric Huang, Jhubei (TW); Tsung-Yi Huang, Hsin-Chu (TW); Fu-Hsin Chen, Jhudong Township (TW); Chyi-Chyuan Huang, Taipei (JP); Chung-Yeh Wu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 327 days.

(21) Appl. No.: 12/170,246

(22) Filed: Jul. 9, 2008

(65) Prior Publication Data

US 2010/0006935 A1    Jan. 14, 2010

(51) Int. Cl.
   *H01L 29/78* (2006.01)

(52) U.S. Cl. ........ 257/341; 257/342; 257/343; 257/345; 257/391; 257/401; 257/404; 257/E29.053; 257/E29.256

(58) Field of Classification Search .................. 257/341, 257/342, 343, 345, 391, 401, 404, 409, E29.053, 257/E29.256
See application file for complete search history.

(56) References Cited

U.S. PATENT DOCUMENTS

| | | | |
|---|---|---|---|
| 5,306,652 A | 4/1994 | Kwon et al. | |
| 5,541,435 A | 7/1996 | Beasom | |
| 6,265,752 B1 | 7/2001 | Liu et al. | |
| 6,486,034 B1 | 11/2002 | Huang et al. | |
| 6,713,331 B2 | 3/2004 | Nishibe et al. | |
| 6,873,011 B1 * | 3/2005 | Huang et al. | 257/345 |
| 6,924,531 B2 | 8/2005 | Chen et al. | |
| 7,202,531 B2 | 4/2007 | Imahashi et al. | |
| 7,476,591 B2 * | 1/2009 | Huang et al. | 438/286 |
| 7,508,032 B2 | 3/2009 | Chiang et al. | |
| 7,576,391 B2 | 8/2009 | Williams et al. | |
| 7,768,071 B2 | 8/2010 | Huang et al. | |
| 2004/0178443 A1 | 9/2004 | Hossain et al. | |
| 2004/0217419 A1 * | 11/2004 | Rumennik et al. | 257/343 |
| 2007/0262398 A1 * | 11/2007 | Darwish et al. | 257/409 |
| 2008/0265292 A1 | 10/2008 | Huang et al. | |
| 2008/0299751 A1 * | 12/2008 | Quddus et al. | 438/571 |

(Continued)

OTHER PUBLICATIONS

Imam, M., et al., "Design and Optimization of Double-RESURF High-Voltage Lateral Devices for a Manufacturable Process," IEEE Transactions on Electron Devices, vol. 50, No. 7, Jul. 2003, pp. 1697-1701.

(Continued)

*Primary Examiner* — Kenneth A Parker
*Assistant Examiner* — David Spalla
(74) *Attorney, Agent, or Firm* — Slater & Matsil, L.L.P.

(57) ABSTRACT

A semiconductor structure includes a semiconductor substrate of a first conductivity type; a pre-high-voltage well (pre-HVW) in the semiconductor substrate, wherein the pre-HVW is of a second conductivity type opposite the first conductivity type; a high-voltage well (HVW) over the pre-HVW, wherein the HVW is of the second conductivity type; a field ring of the first conductivity type occupying a top portion of the HVW, wherein at least one of the pre-HVW, the HVW, and the field ring comprises at least two tunnels; an insulation region over the field ring and a portion of the HVW; a drain region in the HVW and adjacent the insulation region; a gate electrode over a portion the insulation region; and a source region on an opposite side of the gate electrode than the drain region.

20 Claims, 10 Drawing Sheets

U.S. PATENT DOCUMENTS

| | | |
|---|---|---|
| 2009/0001462 A1* | 1/2009 | Huang et al. .................. 257/343 |
| 2009/0039424 A1* | 2/2009 | Su et al. ......................... 257/339 |
| 2009/0085101 A1 | 4/2009 | Huang et al. |
| 2010/0006935 A1* | 1/2010 | Huang et al. .................. 257/341 |

OTHER PUBLICATIONS

Kim, M.-H., et aL, "A Low On- Resistance 700V Charge Balanced LDMOS with Intersected WELL Structure.," ESSDERC 2002, pp. 367-370.

Quddus, M. T., et al., "Drain Voltage Dependence of On Resistance in 700V Super Junction LDMOS Transistor," Proceedings of 2004 International Symposium on Power Semiconductor Devices & ICs, Kitakyushu, pp. 201-204.

Disney, D. R., et al., "A New 800V Lateral MOSFET with Dual Conduction Paths," Proceedings of 2001 International Symposium on Power Semiconductor Devices & ICs, Osaka, pp. 399-402.

Hossain, Z., et al., "Field-Plate Effects on the Breakdown Voltage of an Integrated High-Voltage LDMOS Transistor," Proceedings of 2004 International Symposium on Power Semiconductor Devices & ICs, Kitakyushu, pp. 237-240.

Nezar, A., et al., "Breakdown Voltage in LDMOS Transistors Using Internal Field Rings," IEEE Transactions on Electron Devices, vol. 38, No. 7, Jul. 1991, pp. 1676-1680.

Gao, S., et al., "Analytical Model for Surface Electrical Field of Double RESURF LDMOS with Field Plate," 2006, IEEE, 3 pages.

Liu, M., et al., "A Fully Resurfed, BiCMOS-Compatible, High Voltage MOS Transistor," $8^{th}$ International Symposium on Power Semiconductor Devices and ICS, 1996, ISPSD '96 Proceedings, Maui, HI, May 20-23, 1996, IEEE, pp. 143-146.

Nassif-Khalil, S.G., et al., "SJ/RESURF LDMOST," IEEE Transactions on Electron Devices, vol. 51, No. 7, Jul. 2004, pp. 1185-1191.

Ramezani, M., et al., "A Monolithic IGBT Gate Driver Implemented in a Conventional 0.8 µm BiCMOS Process," Proceedings of the $10^{th}$ International Symposium on Power Semiconductor Devices & ICs, ISPSD '98, Kyoto, Jun. 3-6, 1998, IEEE, pp. 109-112.

Terashima, T., et al., "Over 1000V n-ch LDMOSFET and p-ch LIGBT with JI RESURF Structure and Multiple Floating Field Plate," Proceedings of the $7^{th}$ International Symposium on Power Semiconductor Devices and ICs, Yokohama, May 23-25, 1995, pp. 455-459.

* cited by examiner

BREAKDOWN VOLTAGES OF ULTRA-HIGH VOLTAGE DEVICES BY FORMING TUNNELS

CROSS-REFERENCE TO RELATED APPLICATION

The present application is related to commonly-assigned U.S. patent application Ser. No. 11/581,178, filed on Oct. 13, 2006, and entitled "Lateral Power MOSFET with High Breakdown Voltage and Low On-Resistance," which application is hereby incorporated herein by reference.

TECHNICAL FIELD

This invention relates generally to semiconductor structures and methods, and more particularly to high voltage metal-oxide-semiconductor field-effect transistors (MOSFET).

BACKGROUND

Figure 1A:
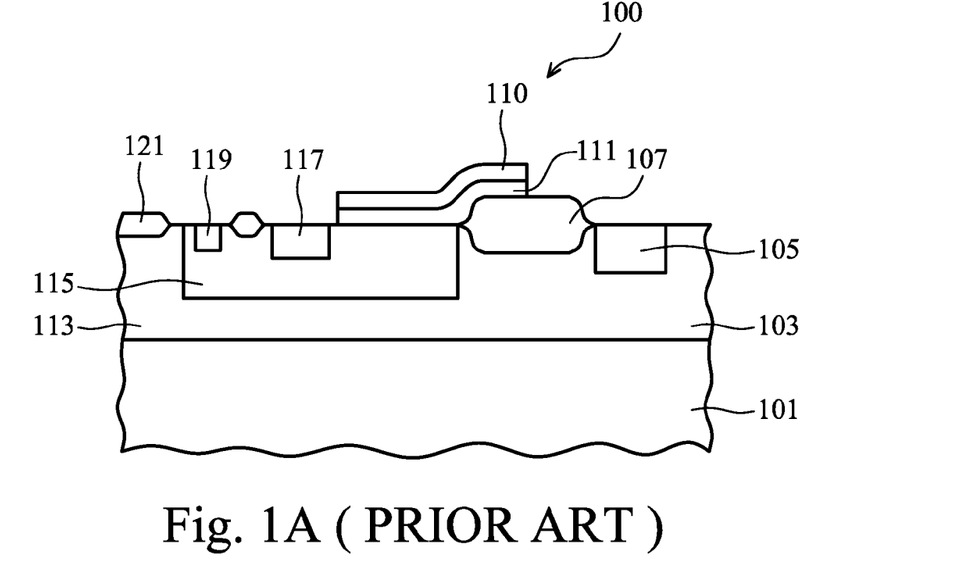
FIG. 1A is a cross-sectional view of a conventional ultra-high-voltage metal-oxide-semiconductor field-effect transistor (MOSFET)

Ultra-high voltage metal-oxide-semiconductor field effect transistors (MOSFET) were typically fabricated with coplanar drain and source regions. FIG. 1A shows an ultra-high voltage MOSFET device 100 in the prior art. Device 100 is formed on a p-type substrate 101, and another p-layer 113 is epitaxially grown on substrate 101. High-voltage p-well 115 is adjacent high-voltage n-well 103 in the epitaxially grown p-layer 113. N+ source 117 is positioned in the high-voltage p-well 115, and N+ drain 105 is positioned in high-voltage n-well 103. Gate dielectric 111 and gate electrode 110 extend from over the N+ source 117 to over a portion of the field oxide 107. Device 100 also includes P+ pickup region 119 located in the high-voltage p-well 115. Applying a positive voltage to the gate electrode 110 induces a current to flow through the channel from the N+ source 117 into the high-voltage n-well 103, which current is collected at the N+ drain 105.

A problem with this type of ultra-high voltage MOSFET is that it cannot maintain a low on-resistance when a high voltage is applied on the ultra-high voltage MOSFET. The on-resistance affects the power transformed into heat as the current travels through the device. The greater the on-resistance of the device, the less efficient the device. Accordingly, it is desirable to reduce this resistance as much as possible for a more efficient device.

Figure 1B:
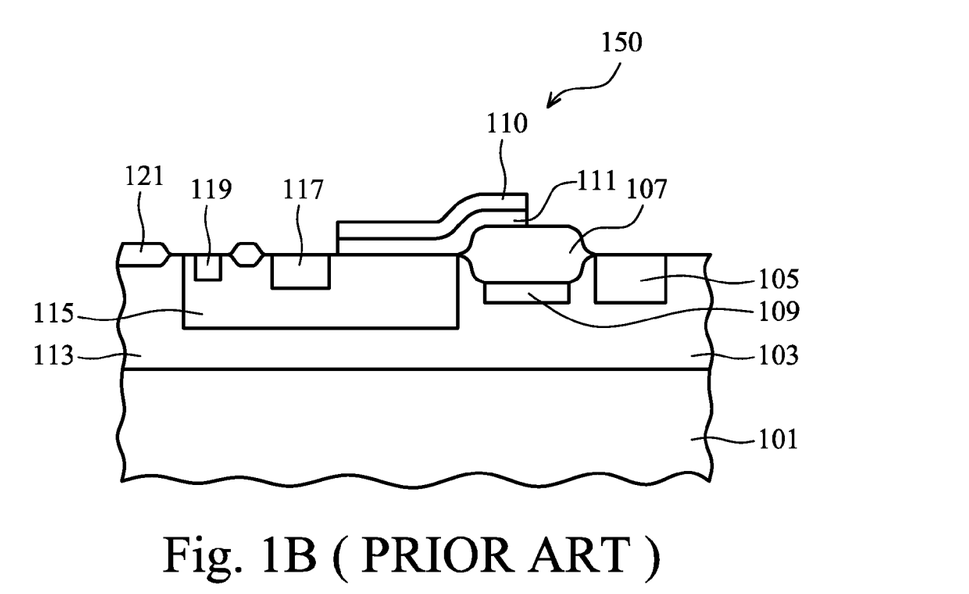
FIG. 1B is a cross-sectional view of a conventional ultra-high voltage MOSFET having a field ring.

FIG. 1B illustrates another device 150 known in the prior art that is designed to mitigate this problem. Device 150 is similar to device 100 of FIG. 1A, wherein like reference numerals are used to refer to like elements, except field ring 109 has been added. Field ring 109 works to reduce the surface electrical field and improves the depletion capability of the drift region. As a result, the doping concentration of the drift region can be increased and the on-resistance of the device 150 can be reduced compared to that of device 100.

The breakdown voltages of prior art device 100 (shown in FIG. 1A) and the prior art device 150 (shown in FIG. 1B) are still not satisfactory. As is known in the art, devices can only be operated at voltages lower than the respective breakdown voltages. When a voltage greater than the breakdown voltage is applied on devices such as device 100 and device 150, catastrophic and irreversible damages occur to the devices, rendering the devices commercially useless and requiring the devices to be replaced. Accordingly, increasing the breakdown voltage is highly desirable. An improved ultra-high voltage MOSFET is thus needed for a reduced on-resistance and a further increased breakdown voltage.

SUMMARY OF THE INVENTION

These and other problems are generally solved or circumvented, and technical advantages are generally achieved, by embodiments of the present invention that allow for an extended drift region in a ultra-high voltage MOSFET that has a reduced on-resistance and an increased breakdown voltage when the device is placed under high voltage.

In accordance with one aspect of the present invention, a semiconductor structure includes a semiconductor substrate of a first conductivity type; a pre-high-voltage well (pre-HVW) in the semiconductor substrate, wherein the pre-HVW is of a second conductivity type opposite the first conductivity type; a high-voltage well (HVW) over the pre-HVW, wherein the HVW is of the second conductivity type; a field ring of the first conductivity type occupying a top portion of the HVW, wherein at least one of the pre-HVW, the HVW, and the field ring has at least two tunnels; an insulation region over the field ring and a portion of the HVW; a drain region in the HVW and adjacent the insulation region; a gate electrode over a portion the insulation region; and a source region on an opposite side of the gate electrode than the drain region.

In accordance with another aspect of the present invention, a semiconductor structure includes a semiconductor substrate of a first conductivity type; a pre-HVW in the semiconductor substrate, wherein the pre-HVW is of a second conductivity type opposite the first conductivity type; a HVW over and contacting the pre-HVW, wherein the HVW is of the second conductivity type; and a plurality of first tunnels of the second conductivity type extending from a top surface of the HVW to a bottom surface of the pre-HVW. The portions of the plurality of first tunnels in the pre-HVW have a second-conductivity-type impurity concentration lower than a second-conductivity-type impurity concentration in the pre-HVW. The portions of the plurality of first tunnels in the HVW have a second-conductivity-type impurity concentration lower than a second-conductivity-type impurity concentration in the HVW. The semiconductor structure further includes a field ring in a top portion of the HVW, wherein the field ring is of the first conductivity type; a plurality of second tunnels of the first conductivity type in the field ring, wherein the plurality of second tunnels have a first-conductivity-type impurity concentration lower than a first-conductivity-type impurity concentration in the field ring; a drain region in the HVW; an insulation region over the field ring; a gate electrode over a portion of the insulation region; and a source region on an opposite side of the gate electrode than the drain region, wherein the source region and the drain region are of the second conductivity type.

In accordance with yet another aspect of the present invention, a semiconductor structure includes a semiconductor substrate of a first conductivity type; a pre-HVW in the semiconductor substrate, wherein the pre-HVW is of a second conductivity type opposite the first conductivity type; a HVW over and contacting the pre-HVW, wherein the HVW is of the second conductivity type, and has a higher impurity concentration than the pre-HVW; and a plurality of first tunnels of the second conductivity type extending from a top surface of the HVW to a bottom surface of the pre-HVW. The portions of the plurality of first tunnels in the pre-HVW and the HVW have second-conductivity-type impurity concentrations lower than second-conductivity-type impurity concentrations in the pre-HVW and the HVW, respectively. The semiconductor structure further includes a field ring of the first conductivity type in a top portion of the HVW, wherein each of the pre-HVW, the HVW and the field ring comprises a linear region and a curvature region, and wherein each of the curvature regions further comprises an inner region and an outer region; a plurality of second tunnels of the first conductivity type in the field ring, wherein the plurality of second tunnels have a first-conductivity-type impurity concentration lower than an first-conductivity-type impurity concentration of the field ring, and wherein the plurality of the first and the second tunnels are in the inner regions of the pre-HVW, the HVW, and the field ring; a drain region in the HVW; an insulation region over and contacting the field ring; a gate electrode over a portion of the insulation region; and a source region on an opposite side of the gate electrode than the drain region, wherein the source region and the drain region are of the second conductivity type.

In accordance with yet another aspect of the present invention, a method of forming a semiconductor structure includes providing a semiconductor substrate of a first conductivity type; forming a pre-HVW in the semiconductor substrate, wherein the pre-HVW is of a second conductivity type opposite the first conductivity type; forming a HVW over and contacting the pre-HVW, wherein the HVW is of the second conductivity type; and forming a plurality of first tunnels of the second conductivity type extending from a top surface of the HVW to a bottom surface of the pre-HVW. The portions of the plurality of first tunnels in the pre-HVW have a second-conductivity-type impurity concentration lower than a second-conductivity-type impurity concentration in the pre-HVW. The portions of the plurality of first tunnels in the HVW have a second-conductivity-type impurity concentration lower than a second-conductivity-type impurity concentration in the HVW. The method further includes forming a field ring occupying a top portion of the HVW, wherein the field ring is of the first conductivity type; forming a plurality of second tunnels of the first conductivity type in the field ring, wherein the plurality of second tunnels have a first-conductivity-type impurity concentration lower than a first-conductivity-type impurity concentration of the field ring; forming an insulation region over and contacting the field ring and a portion of the HVW; forming a gate electrode over a portion of the insulation region; and forming a source region and a drain region on opposite sides of the gate electrode.

In accordance with yet another aspect of the present invention, a method of forming a semiconductor structure includes providing a semiconductor substrate of a first conductivity type; forming a first photo resist over the semiconductor substrate, wherein the first photo resist is slotted with at least two slots and two openings; implanting a top portion of the semiconductor substrate through the first photo resist to form a pre-HVW, wherein the pre-HVW is of a second conductivity type opposite the first conductivity type; epitaxially growing a semiconductor layer on the semiconductor substrate and the pre-HVW to form an epitaxy layer; forming a second photo resist over the epitaxy layer, wherein the second photo resist is slotted with at least two slots and two openings; implanting a portion of the epitaxy layer to form a HVW over and contacting the pre-HVW, wherein the HVW is of the second conductivity type; forming a third photo resist over the epitaxy layer, wherein the third photo resist is slotted with at least two slots and two openings; and implanting a top portion of the HVW to form a field ring of the first conductivity type.

By using the embodiments of the present invention, the on-resistances of the high-voltage MOSFETs are reduced and the breakdown voltages of the devices are increased. Advantageously, the embodiments of the present invention do not require additional masks.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel high-voltage metal-oxide-semiconductor field-effect transistor (MOSFET) having a reduced on-resistance, an increased breakdown voltage, an increased stability, and the method of forming the same are provided. The manufacturing process of this device is detailed in the following paragraphs. Throughout the various views and illustrative embodiments of the present invention, like reference numbers are used to designate like elements.

Figure 2:
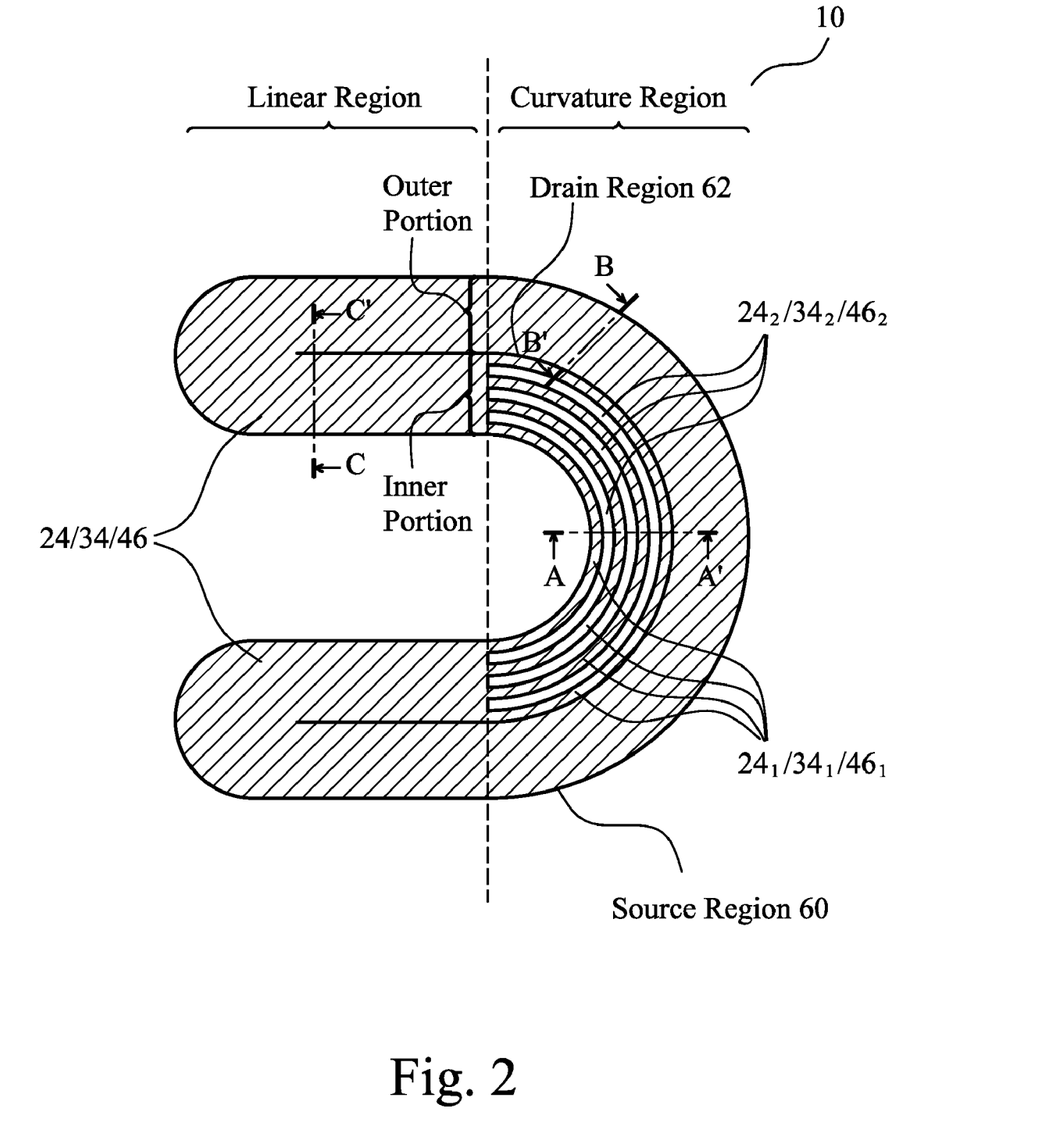
FIG. 2 illustrates a top view of an embodiment of the present invention.

FIG. 2 illustrates a top view of UHV MOSFET 10. For a clearer view, only select components are illustrated. The remaining components may be found in cross-sectional views, such as what are shown in FIG. 3I. MOSFET 10 includes linear regions and a curvature region. The shaded regions are portions of field ring 46. The drain region 62 is formed in the center of, and encircled by, field ring 46. Source region 60 surrounds field ring 46, and forms a closed loop. Typically, UHV MOSFET 10 occupies a big area, and hence the source region 60 and drain region 62 are narrow compared to the length and the width of UHV MOSFET 10. Accordingly, each of the source region 60 and drain region 62 is shown using only a line. However, each of them may actually have a width of several microns, for example.

The curvature region is separated by drain region 62 into an inner portion and an outer portion, wherein the inner portion is closer to the center of the curve than the outer portion. In the inner portion, field-ring 46 is slotted, with alternating slots $46_1$ and $46_2$ having alternating concentrations. The shaded slots of field-ring 46 may have higher concentrations than the un-shaded slots $46_2$, which are between the shaded slots $46_1$. The details are illustrated in subsequent paragraphs. Throughout the description, the un-shaded slots $46_2$ are referred to as tunnels. In an embodiment, in the outer portion of the curvature region, field ring 46 is preferably uniformly doped. However, it may also have alternating doping concentrations similar to the inner portion. Similarly, in the linear region, field ring 46 is preferably uniformly doped. However, the portions of field ring 46 in the linear regions may also have alternating doping concentrations.

FIG. 2 also shows pre-high-voltage n-well region (pre-HVNW) 24 and HVNW region 34 are slotted with alternating concentrations in alternating slots (Note, the edges of regions 24 and 34 may not overlap the edges of region 46, as shown in FIG. 3I. For a clearer view, such differences in the positions of the edges are not shown in FIG. 2). The slots of pre-HVNW region 24 and HVNW region 34 having lower impurity concentrations than their neighboring slots are also referred to as tunnels. In an embodiment, as shown in FIG. 2, the tunnels in pre-HVNW region 24 and HVNW region 34 overlap the tunnels in field ring 46. However, they may also be misaligned.

Figure 3A:
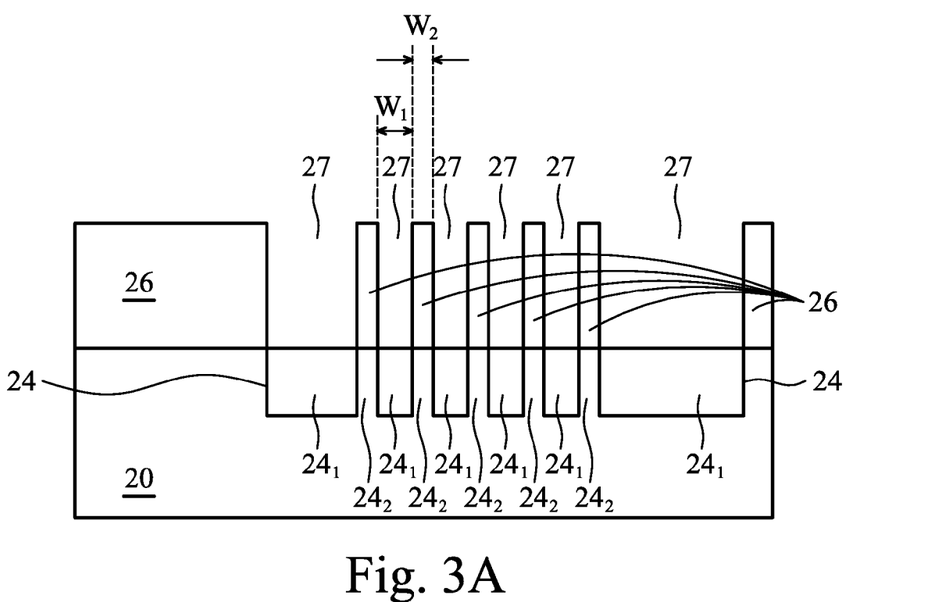
FIGS. 3A through 3I are cross-sectional views of intermediate stages in the formation of the embodiment shown in FIG. 2, wherein the cross-sectional views are taken in a plane crossing line A-A' in FIG. 2.
Figure 3B:
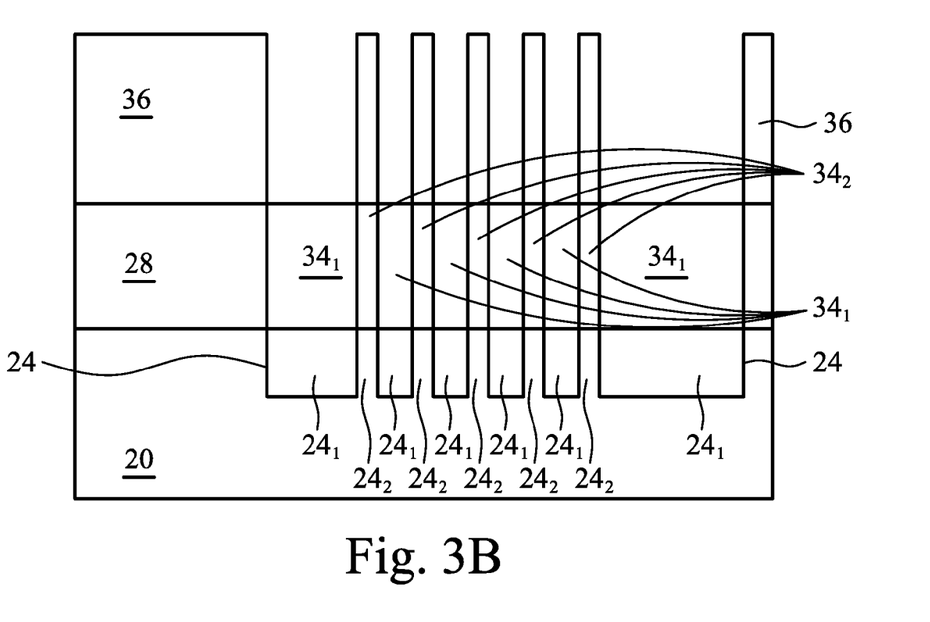
Figure 3C:
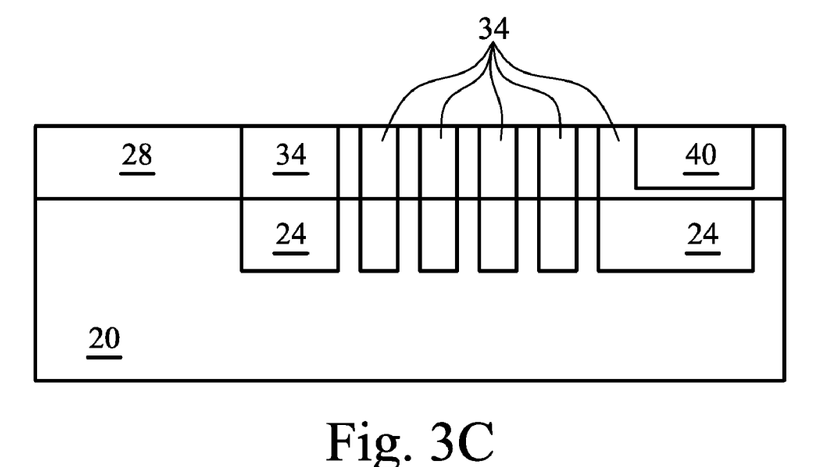
Figure 3D:
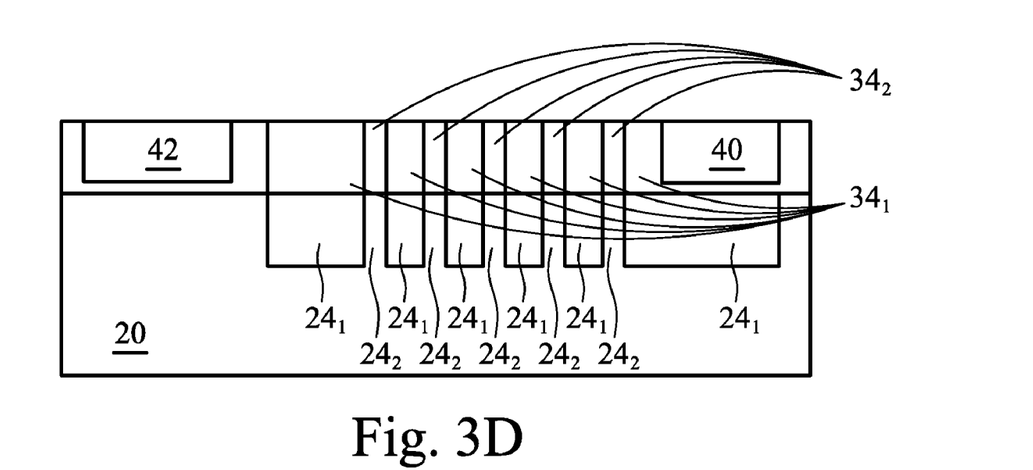
Figure 3E:
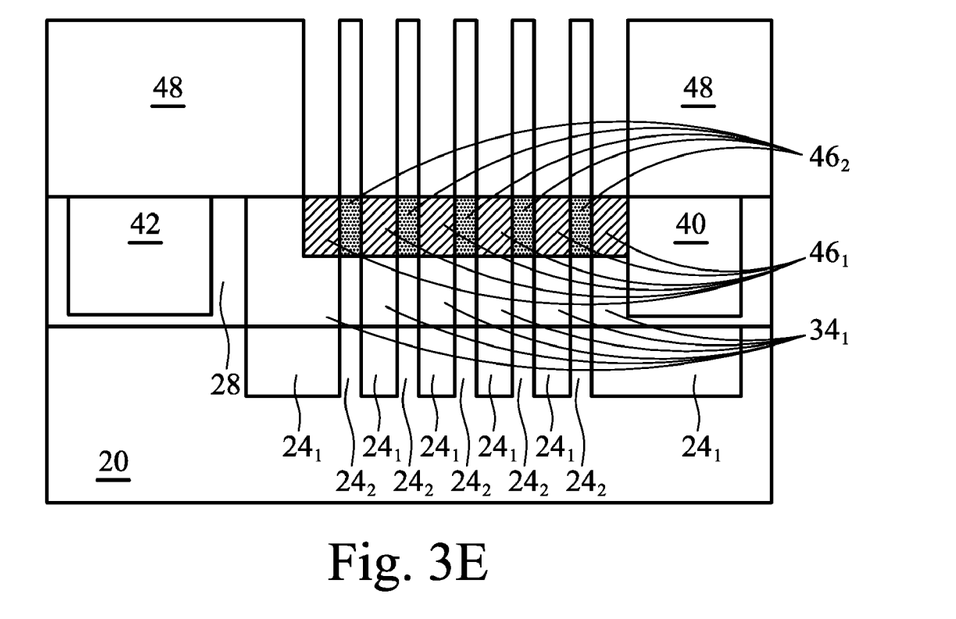
Figure 3F:
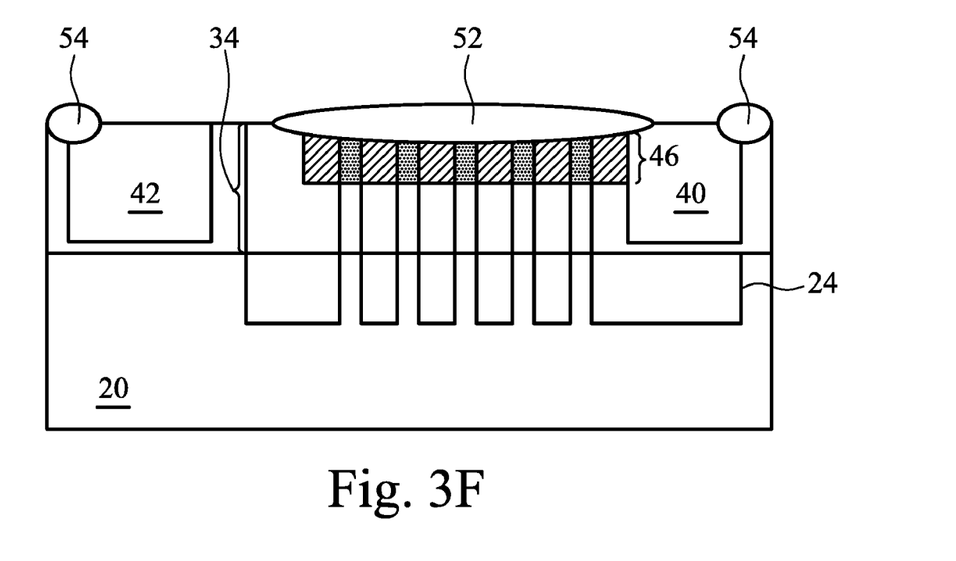
Figure 3G:
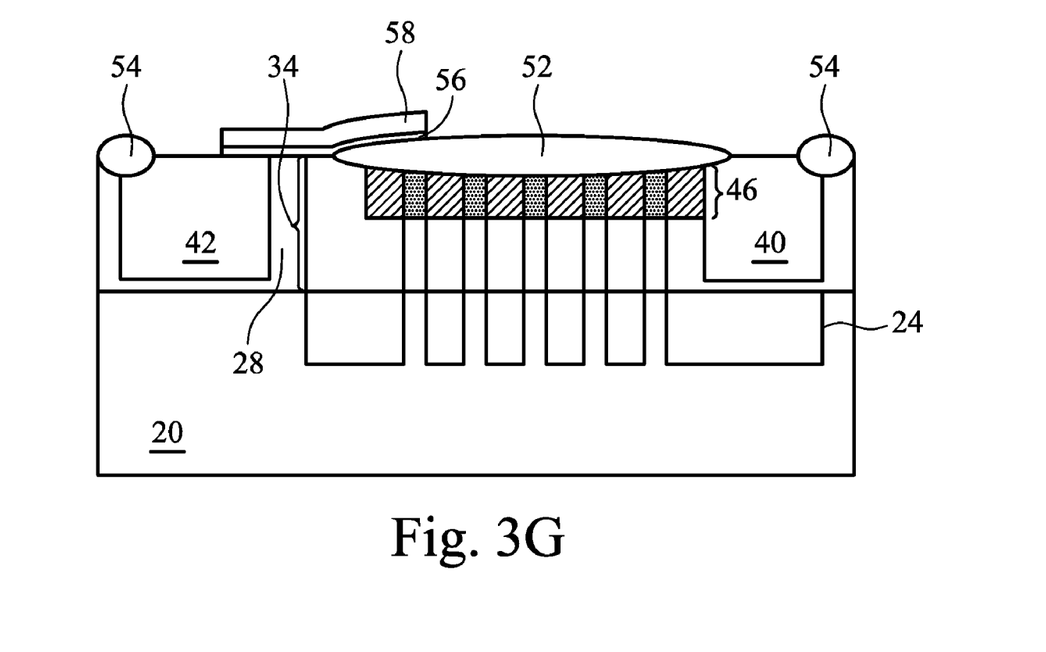
Figure 3H:
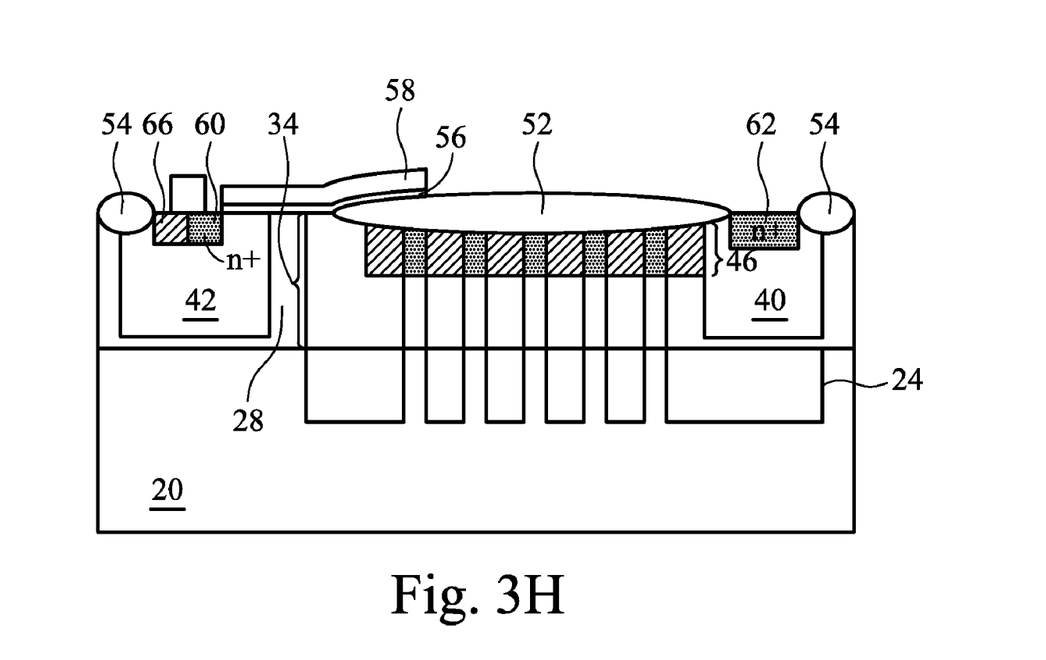
Figure 3I:
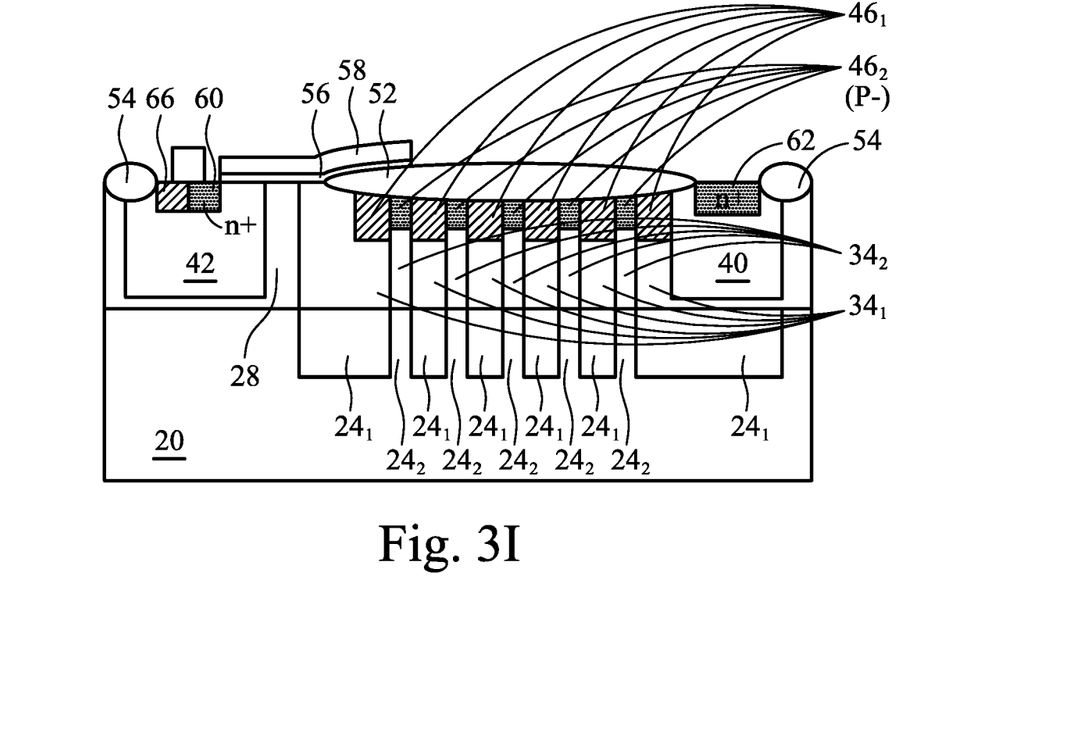

FIGS. 3A through 3I illustrate cross-sectional views of intermediate stages in the formation of UHV MOSFET 10, wherein the cross-sectional views are taken along a plane crossing line A-A' in FIG. 2. Referring to FIG. 3A, semiconductor substrate 20 is provided. Semiconductor substrate 20 preferably includes silicon, and is lightly doped with a p-type impurity. However, other commonly used semiconductor materials such as SiGe or the like may also be used. Pre-HVNW region 24 is formed in a top portion of substrate 20, and is preferably formed by implanting n-type dopants such as phosphorous into the upper region of the substrate 20, for example by forming photo resist 26. Other n-type dopants, such as arsenic, antimony, combinations thereof, or the like, may alternatively be used. In an exemplary embodiment, a dosage of the implantation is between about $1\times10^{10}/cm^2$ and about $1\times10^{16}/cm^2$. Pre-HVNW region 24 preferably has a thickness of between about 2 µm and 10 µm, and more preferably about 8.5 µm, for example. It is realized, however, the dimensions recited throughout the description are merely examples, and may change if different forming technologies are used. After the formation of pre-HVNW region 24, photo resist 26 is removed.

In an embodiment, photo resist 26 is slotted, with at least two, and preferably more than two, slots. Openings 27 are thus formed between the photo resist slots. The portions of pre-HVNW region 24 exposed to openings 27 are referred to as pre-HVNW regions $24_1$, which portions receive direct pre-HVNW implanting. The portions of pre-HVNW 24 covered by photo resist slots 26 are referred to as pre-HVNW tunnels $24_2$, which are not exposed to direct pre-HVNW implanting, but will receive the impurity diffused from pre-HVNW regions $24_1$ in subsequent thermal processes. Accordingly, with the formation of photo resist slots 26, the impurity concentrations in both pre-HVNW regions $24_1$, and pre-HVNW tunnels $24_2$ are reduced due to the diffusion. After the diffusion, the n-type impurity concentration in pre-HVNW regions $24_1$ is higher than that in pre-HVNW tunnels $24_2$, and hence the impurity concentrations are alternating.

As a comparison, in the embodiments wherein pre-HVNW region 24 in the linear region (refer to FIG. 2) is not covered by photo resist slots 26, the impurity concentration in pre-HVNW region 24 is higher. As is known in the art, greater electrical fields are generated where the curvature is greater. Accordingly, the inner portion of the curvature region (refer to FIG. 2) has higher electrical fields than the outer portion and the linear region, and is the weak region. Reducing the impurity concentration of pre-HVNW region 24 in the inner portion of the curvature region helps improve the breakdown voltage of UHV MOSFET 10.

To improve the uniformity of the impurity concentration in pre-HVNW region 24 after the subsequent diffusion, the number of photo resist slots 26 is preferably greater than about 10. Also, to ensure the pre-HVNW portions $24_2$ are converted to n-type after the diffusion, openings 27 preferably have a small width W2. In an exemplary embodiment, width W2 is less than about 4 µm. It is realized that the maximum allowable width W2 is related to the p-type impurity concentration of p-type substrate 20, and the concentration of the implanted n-type impurity in pre-HVNW regions $24_1$. Also, the photo resist slots 26 have a total area, and a ratio of the total area of the photo resist slots 26 to the total area of pre-HVNW region 24 is preferably between about 20 percent and about 80 percent. The area ratio determines the final impurity concentrations in pre-HVNW regions $24_1$ and $24_2$, and the lower the area ratio is, the lower the final impurity concentrations will be. The area ratio is determined by the width ratio. Accordingly, a ratio of width WI of openings 27 to width W2 of photo resist slots 26 is preferably between ¼ and 4.

FIG. 3B illustrates doped semiconductor layer 28 being formed over substrate 20 and pre-HVNW region 24. The doped semiconductor layer 28 comprises a semiconductor material such as silicon, and may be grown epitaxially. Accordingly, the doped semiconductor material is alternatively referred to as epitaxy layer 28. The thickness of doped semiconductor layer 28 may be greater than about 8.5 µm. Preferably, semiconductor layer 28 is in-situ doped with a p-type impurity while the epitaxial growth proceeds.

FIG. 3B also illustrates the formation of high-voltage n-well (HVNW) region 34. HVNW region 34 may be formed by implanting an n-type dopant such as phosphorous, arsenic, antimony, or the like, through photo resist 36. Preferably, the concentration of HVNW region 34 is greater than the impurity concentration of pre-HVNW region 24, and may be formed using a dosage between about $1\times10^{10}/cm^2$ and about $1\times10^{16}/cm^2$. In an embodiment, the thickness of HVNW region 34 is substantially equal to the thickness of epitaxy layer 28, and hence HVNW region 34 adjoins pre-HVNW region 24.

Similar to pre-HVNW region 24, HVNW region 34 preferably has alternating impurity concentrations in the inner portion of the curvature region (refer to FIG. 2). Therefore, photo resist 36 is preferably slotted, and hence HVNW region 34 includes directly implanted portions $46_1$, and portions $46_2$ (also referred to tunnels) covered by the slots of photo resist 36. The impurity concentration in tunnels $46_2$ is lower than the portions $46_1$ after the subsequent diffusion processes. HVNW region 34 may have a uniform impurity concentration in the outer portion of the curvature region and/or the liner regions (refer to FIG. 2), although alternating impurity concentrations may also be adopted. Preferably, photo resist 36 may be formed using a same mask (for defining lithography patterns) as for forming photo resist 26. Accordingly, the directly implanted HVNW portions $34_1$ are vertically aligned to directly implanted pre-HVNW portions $24_1$, and the HVNW tunnels $34_2$ are vertically aligned to pre-HVNW tunnels $24_2$. In alternative embodiments, photo resists 26 and 36 are formed using different masks, and the directly implanted HVNW portions $34_1$ may or may not be vertically aligned to directly implanted pre-HVNW portions $24_1$.

FIG. 3C illustrates the formation of n-well 40. Preferably, n-well 40 is formed by forming a photo resist (not shown), and implanting an n-type impurity, for example, to a concentration greater than that of HVNW region 34. In an exemplary embodiment, the dosage of the implantation is between about $1 \times 10^{10}/cm^2$ and about $1 \times 10^{16}/cm^2$. N-well 40 preferably has a bottom surface higher than the bottom surface of HVNW region 34. Alternatively, the bottom surface of n-well 40 may be level with, or lower than, the bottom surface of HVNW region 34.

FIG. 3D illustrates the formation of p-well region 42. Preferably, p-well region 42 is formed adjacent to HVNW region 34. In an embodiment, p-well region 42 is spaced apart from HVNW region 34, as shown in FIG. 3D. In alternative embodiments, p-well region 42 adjoins HVNW region 34 such that a junction between the two wells is created. P-well region 42 may be formed by forming a photo resist (not shown), and implanting a desired portion of the P-epi layer 28 with a p-type dopant such as boron, indium, or the like. An exemplary dosage of the implantation is between about $1 \times 10^{10}/cm^2$ to about $1 \times 10^{16}/cm^2$. In an embodiment, p-well region 42 has a depth of between about 2 μm and about 6 μm, with a preferred depth of about 4 μm.

FIG. 3E illustrates the counter-doping of a portion of n-well 34 with a p-type dopant to form counter-doped region 46. In an embodiment, counter-doped region 46 has a ring shape (refer to FIG. 2), and hence is alternatively referred to as field ring 46 throughout the description. Field ring 46 may be formed by doping a top portion of the HVNW region 34 with a p-type dopant to a depth smaller than the depth of HVNW region 34. The thickness of field ring 46 is great enough, so that after the subsequent formation of field dielectric 52 as shown in FIG. 3F, there is still a remaining portion of field ring 46 under field dielectric 52. An exemplary depth of field ring 46 is between about 0.4 μm to about 2 μm, and preferably about 1 μm. Field ring 46 may adjoin, or be spaced apart from, n-well region 40.

Similar to pre-HVNW region 24 and HVNW region 34, field ring 46 preferably has alternating impurity concentrations. Therefore, photo resist 48 is preferably slotted, and hence field ring 46 includes directly implanted portions $46_1$, and portions $46_2$ (also referred to tunnels) covered by the slots of photo resist 48. In an embodiment, the directly implanted portions $46_1$ are vertically aligned to the directly implanted pre-HVNW portions $24_1$, and the portions $46_2$ are vertically aligned to the directly implanted pre-HVNW portions $24_2$. In alternative embodiments, the directly implanted portions $46_1$ are not vertically aligned to directly implanted pre-HVNW portions $24_1$.

In an embodiment, a well drive-in process may be performed at an elevated temperature, so that the impurities in directly implanted regions $24_1$, $34_1$, and $46_1$ diffuse to regions $24_2$, $34_2$, and $46_2$, respectively. However, since the formation may include a plurality of high temperature processes, each contributing to the diffusion, the effects caused by the diffusion is not shown until FIG. 3I.

FIG. 3F illustrates the formation of insulator 52 over a portion of HVNW region 34. Additional insulator 54 may be formed over portions of the p-well region 42 and P-epi layer 28, and the like. Insulators 52 and 54 may be formed using local oxidation of silicon (LOCOS), or may be shallow trench isolation (STI) regions.

FIG. 3G shows the formation of gate dielectric 56 and gate electrode 58. Gate dielectric 56 is deposited over an upper portion of field dielectric 52 and extends to cover a portion of the p-well region 42. Gate electrode 58 is deposited over the gate dielectric 56. Gate electrode 58 is conductive and may be formed using doped polysilicon, metals, metal alloys, or the like. In the case gate electrode 58 comprises polysilicon, a surface of the gate electrode 58 may be silicided.

FIG. 3H illustrates the formation of source region 60 in p-well region 42, and drain region 62 in n-well 40. Source region 60 and the drain region 62 can be formed by implanting an n-type dopant such as phosphorous to a concentration of between about $1 \times 10^{19}/cm^3$ and about $2 \times 10^{21}/cm^3$, as an example. Pickup region 66, which is of p-type, is formed in p-well region 42, with an exemplary concentration of between about $1 \times 10^{19}/cm^3$ and about $2 \times 10^{21}/cm^3$.

As mentioned in the preceding paragraphs, the structure shown in FIG. 3H will experience various steps having thermal budgets. Accordingly, the impurities in directly implanted regions $24_1$, $34_1$, and $46_1$ will diffuse to adjacent tunnels $24_2$, $34_2$, and $46_2$, respectively. The resulting structure is shown in FIG. 3I. After the implantation, regions $24_1$, $24_2$, $34_1$, and $34_2$ are of n-type, and regions $24_1$ and $34_1$ will have a higher impurity concentration than tunnels $24_2$ and $34_2$, respectively. Similarly, regions $46_1$ and $46_2$ are of p-type, and region $46_1$ will have a higher impurity concentration than tunnels $46_2$.

Due to the diffusion, the impurity concentrations of regions 24, 34, and 46 in the inner portion of the curvature region (refer to FIG. 2) will be substantially less than the impurity concentrations in the respective regions in the linear regions, wherein the respective portions in the linear regions are not covered during the respective implantations. In an exemplary embodiment, after the diffusion and the final packaging process, the impurity concentrations in the directly implanted regions $24_1$, $34_1$, and $46_1$ are less than about 80 percent of the respective implanted regions 24, 34, and 46 in the linear regions. Further, after the diffusion and the final packaging process, the impurity concentrations in tunnels $24_2$, $34_2$, and $46_2$ may be less than about 80 percent of the respective directly implanted regions $24_1$, $34_1$, and $46_1$.

Figure 4:
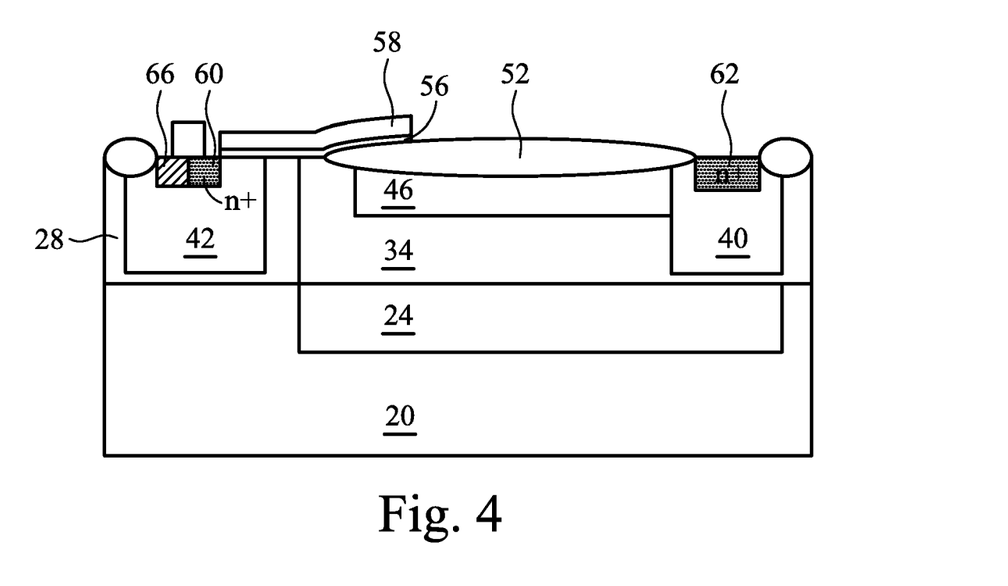
FIG. 4 is a cross-sectional view of the embodiment shown in FIG. 2, wherein the cross-sectional view is taken in planes crossing line B-B' and/or C-C' in FIG. 2.

FIG. 4 illustrates another cross-sectional view of UHV MOSFET 10 in FIG. 2, wherein the cross-sectional views are taken along planes crossing line B-B' and/or C-C'. In an embodiment, in the outer portion of the curvature region and the linear regions (refer to FIG. 2), regions 24, 34, and 46 are not slotted, as shown in FIG. 4. Alternatively, the outer portion of the curvature region and/or the linear regions of UHV MOSFET 10 may also have alternating doping concentrations in field ring 46, pre-HVNW region 24, and HVNW region 34.

Figure 5:
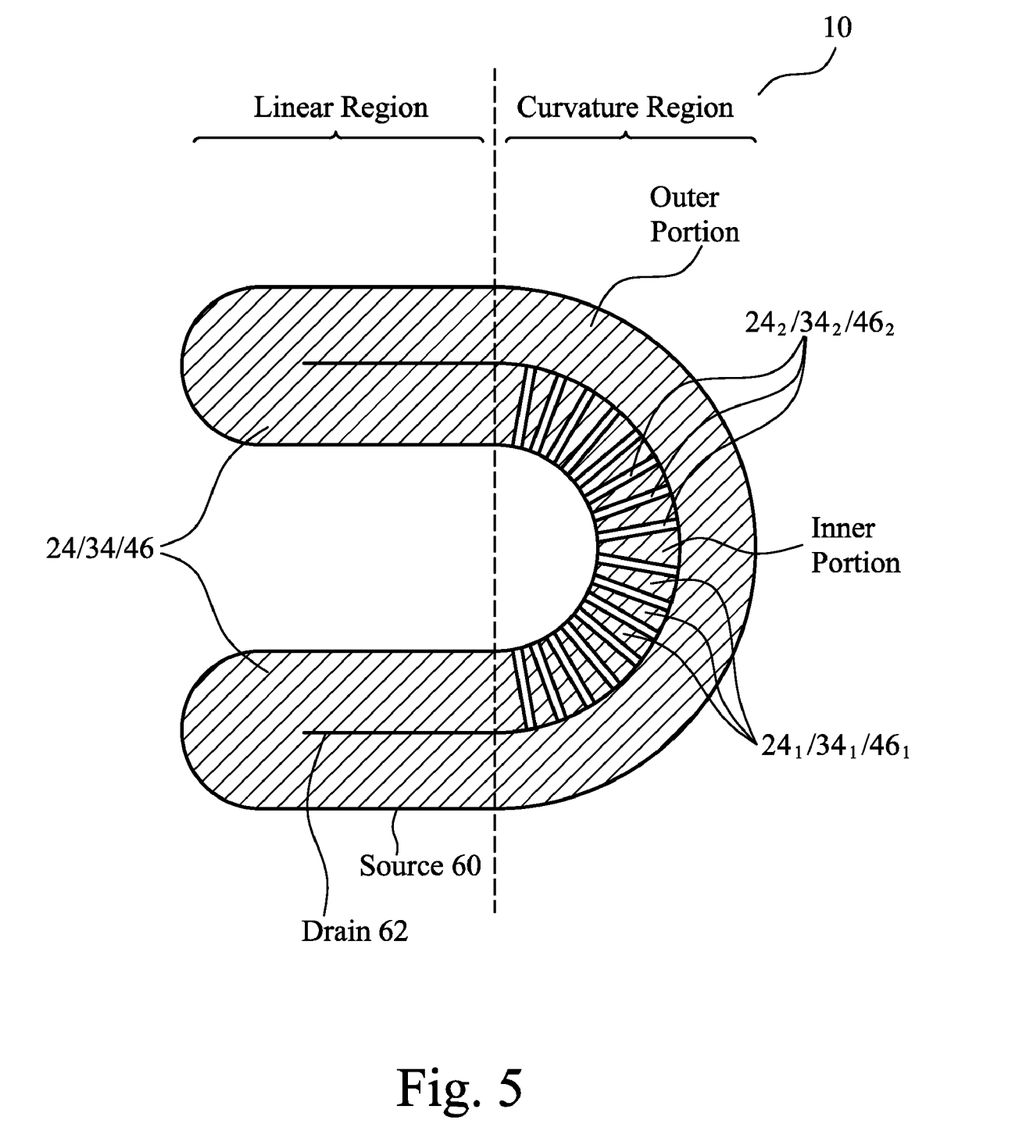
FIG. 5 illustrates a top view of an alternative embodiment of the present invention, wherein tunnels are formed in a direction perpendicular to the direction of the tunnels shown in FIG. 2.

The embodiments of the present invention have various alternative forms. For example, FIG. 5 illustrates the slots of regions pre-HVNW region 24, HVNW region 34, and field ring 46 in the radius direction, or in other words, perpendicular to the lengthwise directions of source region 60 and drain region 62. Alternatively, the slots of regions 24, 34, and 46 may have any other shape, such as grids (not shown) in the top view. In this case, the grids may be treated as a combination of arc slots, as shown in FIG. 2, and straight slots as shown in FIG. 5.

Figure 6:
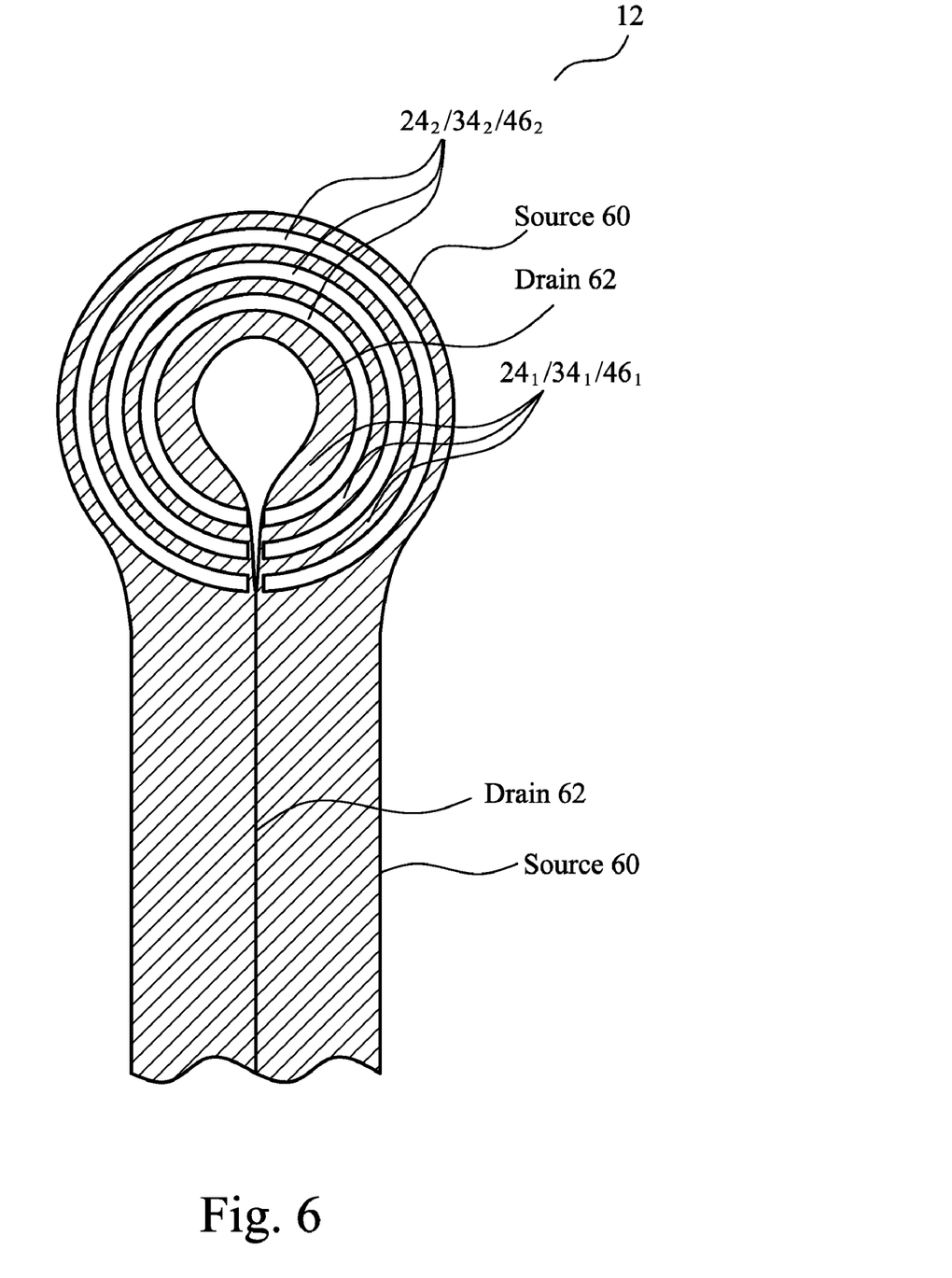
FIG. 6 illustrates a top view of yet another embodiment of the present invention, wherein tunnels are formed as circles.

FIG. 6 illustrates an alternative UHV MOSFET 12, which includes source region 60 and drain region 62, forming arcs at the end. In this embodiment, the pre-HVNW region 24, HVNW region 34, and field ring 46 may include alternating implanted regions, and the shapes of the slots of pre-HVNW region 24, HVNW region 34, and field ring 46 are circles, or at least, close to circles.

As one of ordinary skill in the art will appreciate, embodiments as presented herein are merely illustrative embodiments of the present invention. For example, while the discussed embodiment is an n-type UHV MOSFET, other embodiments could be p-type UHV MOSFETs, with the conductivity types of source/drain regions, high-voltage well regions, pre-HVNW region, well-regions, substrate, tunnels, and the like, inverted.

Figure 7:
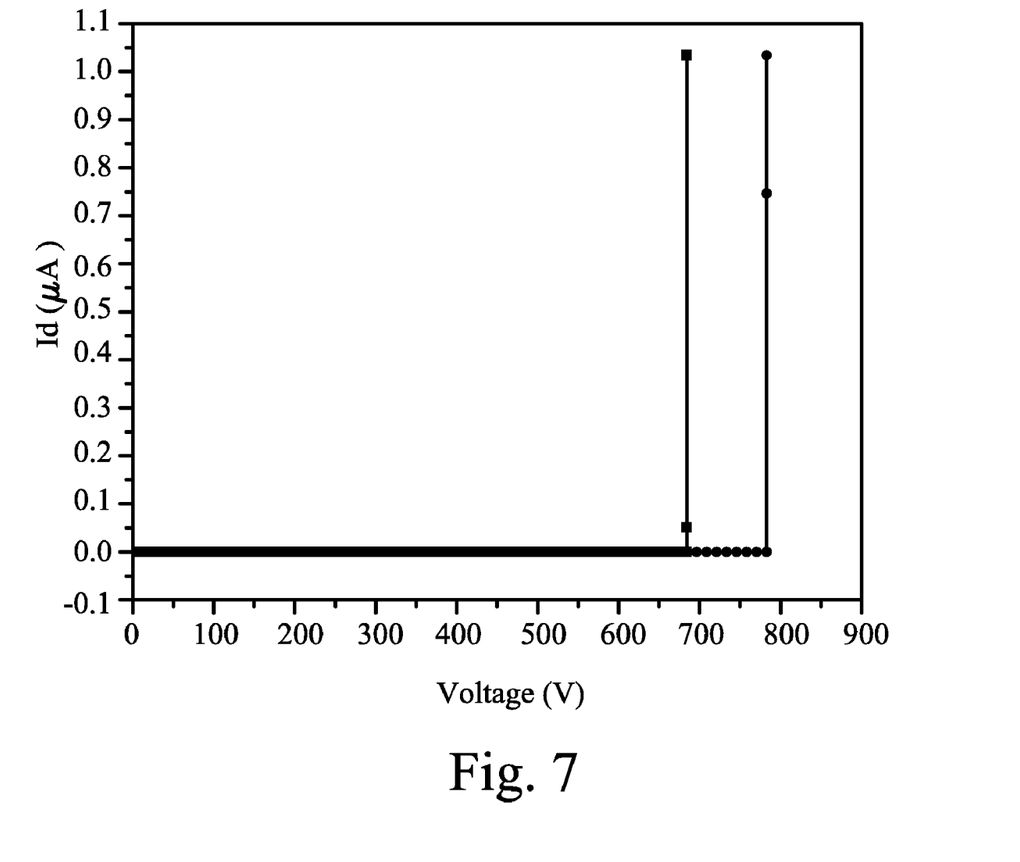
FIG. 7 illustrates drain currents as a function of voltages.

Advantageously, by implanting alternating slots of pre-HVNW region 24, HVNW region 34, and field ring 46, the impurity concentrations in pre-HVNW region 24, HVNW region 34, and field ring 46 are reduced. This advantageously increases the breakdown voltage of the resulting UHV MOSFETs. This advantageous feature is obtained without the need of additional masks, wherein a same mask is used to cause a different impurity concentration in the inner portion of the curvature region than in other portions/regions. FIG. 7 shows breakdown voltage curves. Circles represent data obtained from samples embodiments of the present invention (as shown in FIG. 3I), while squares represent data obtained from samples whose pre-HVNW, HVNW and field rings are uniformly implanted. The results shown in FIG. 7 revealed that by using the embodiments of the present invention, the breakdown voltages increase from about 700 volts to about 800 volts.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A semiconductor structure comprising:
   a semiconductor substrate of a first conductivity type;
   a pre-high-voltage well (pre-HVW) in the semiconductor substrate, wherein the pre-HVW is of a second conductivity type opposite the first conductivity type;
   a high-voltage well (HVW) over the pre-HVW, wherein the HVW is of the second conductivity type;
   a field ring of the first conductivity type occupying a top portion of the HVW, wherein at least one of the pre-HVW, the HVW, and the field ring comprises at least two tunnels of a same conductivity type as the respective pre-HVW, the HVW, and the field ring, and wherein the tunnels have a lower impurity concentration than the respective one of the pre-HVW, the HVW, and the field ring;
   an insulation region over the field ring and a portion of the HVW;
   a drain region in the HVW and adjacent the insulation region;
   a gate electrode over a portion of the insulation region; and
   a source region on an opposite side of the gate electrode than the drain region.

2. The semiconductor structure of claim 1, wherein each of the pre-HVW, the HVW, and the field ring comprises two tunnels.

3. The semiconductor structure of claim 2, wherein all tunnels in the pre-HVW are aligned to the tunnels in the HVW.

4. The semiconductor structure of claim 3, wherein all tunnels in the pre-HVW, the HVW, and the field ring are vertically aligned.

5. The semiconductor structure of claim 1, wherein the impurity concentration in the tunnels is less than about 80 percent of the impurity concentration in the respective one of the pre-HVW, the HVW, and the field ring.

6. The semiconductor structure of claim 1, wherein the tunnels are in a form of slots.

7. The semiconductor structure of claim 6, wherein the slots are parallel arcs.

8. The semiconductor structure of claim 6, wherein the slots are perpendicular to a lengthwise direction of a nearest portion of the drain region.

9. The semiconductor structure of claim 1 further comprising:
   an additional pre-HVW in the semiconductor substrate, wherein the additional pre-HVW is of the second conductivity type, and is electrically connected to the pre-HVW;
   an additional HVW over and in contact with the additional pre-HVW, wherein the additional HVW is of the second conductivity type, and is electrically connected to the HVW; and
   an additional field ring of the first conductivity type occupying a top portion of the additional HVW, wherein the additional field ring is electrically connected to the field ring, and wherein the additional pre-HVW, the additional HVW, and the additional field ring are free from tunnels, and are on an opposite side of the drain region than the pre-HVW, the HVW, and the field ring, respectively.

10. A semiconductor structure comprising:
    a semiconductor substrate of a first conductivity type;
    a pre-high-voltage well (pre-HVW) in the semiconductor substrate, wherein the pre-HVW is of a second conductivity type opposite the first conductivity type;
    a high-voltage well (HVW) over and contacting the pre-HVW, wherein the HVW is of the second conductivity type;
    a plurality of first tunnels of the second conductivity type extending from a top surface of the HVW to a bottom surface of the pre-HVW, wherein portions of the plurality of first tunnels in the pre-HVW have a second-conductivity-type impurity concentration lower than a second-conductivity-type impurity concentration in the pre-HVW, and portions of the plurality of first tunnels in the HVW have a second-conductivity-type impurity concentration lower than a second-conductivity-type impurity concentration in the HVW;
    a field ring in a top portion of the HVW, wherein the field ring is of the first conductivity type;
    a plurality of second tunnels of the first conductivity type in the field ring, wherein the plurality of second tunnels have a first-conductivity-type impurity concentration lower than a first-conductivity-type impurity concentration in the field ring;
    a drain region in the HVW;
    an insulation region over the field ring;
    a gate electrode over a portion of the insulation region; and a source region on an opposite side of the gate electrode than the drain region, wherein the source region and the drain region are of the second conductivity type.

11. The semiconductor structure of claim 10, wherein the first and the second tunnels are vertically aligned.

12. The semiconductor structure of claim 10 further comprising:
- an additional pre-HVW in the semiconductor substrate, wherein the additional pre-HVW is of the second conductivity type, and is electrically connected to the pre-HVW;
- an additional HVW over and contacting the additional pre-HVW, wherein the additional HVW is of the second conductivity type, and is electrically connected to the HVW; and
- an additional field ring of the first conductivity type in the additional HVW and in a top portion of the additional HVW, wherein the additional field ring is electrically connected to the field ring, and wherein the additional pre-HVW, the additional HVW, and the additional field ring are free from tunnels, and are on an opposite side of the drain region than the pre-HVW, the HVW, and the field ring, respectively.

13. The semiconductor structure of claim 12, wherein the second-conductivity-type impurity concentrations in the pre-HVW and the HVW are lower than about 80 percent of second-conductivity-type impurity concentrations in the additional pre-HVW and the additional HVW, respectively.

14. The semiconductor structure of claim 12, wherein the first-conductivity-type impurity concentration in the field ring is lower than about 80 percent of first-conductivity-type impurity concentration in the additional field ring.

15. A semiconductor structure comprising:
- a semiconductor substrate of a first conductivity type;
- a pre-high-voltage well (pre-HVW) in the semiconductor substrate, wherein the pre-HVW is of a second conductivity type opposite the first conductivity type;
- a high-voltage well (HVW) over and contacting the pre-HVW, wherein the HVW is of the second conductivity type, and has a higher impurity concentration than the pre-HVW;
- a plurality of first tunnels of the second conductivity type extending from a top surface of the HVW to a bottom surface of the pre-HVW, wherein portions of the plurality of first tunnels in the pre-HVW and the HVW have second-conductivity-type impurity concentrations lower than second-conductivity-type impurity concentrations in the pre-HVW and the HVW, respectively;
- a field ring of the first conductivity type in a top portion of the HVW, wherein each of the pre-HVW, the HVW, and the field ring comprises a linear region and a curvature region, and wherein each of the curvature regions further comprises an inner region and an outer region;
- a plurality of second tunnels of the first conductivity type in the field ring, wherein the plurality of second tunnels have a first-conductivity-type impurity concentration lower than a first-conductivity-type impurity concentration of the field ring, and wherein the plurality of the first and the second tunnels are in the inner regions of the pre-HVW, the HVW, and the field ring;
- a drain region in the HVW;
- an insulation region over and contacting the field ring;
- a gate electrode over a portion of the insulation region; and
- a source region on an opposite side of the gate electrode than the drain region, wherein the source region and the drain region are of the second conductivity type.

16. The semiconductor structure of claim 15, wherein the outer region and the linear regions of the pre-HVW, the HVW, and the field ring are free from tunnels.

17. The semiconductor structure of claim 15 further comprising additional tunnels formed in the outer regions of the pre-HVW, the HVW, and the field ring, wherein the linear regions of the pre-HVW, the HVW, and the field ring are free from tunnels.

18. The semiconductor structure of claim 15, wherein the inner region and the outer region of each of the pre-HVW, the HVW, and the field ring are on opposite sides of the drain region.

19. The semiconductor structure of claim 15, wherein the first conductivity type is p-type, and the second conductivity type is n-type.

20. The semiconductor structure of claim 15, wherein the first conductivity type is n-type, and the second conductivity type is p-type.

* * * * *